(12) United States Patent
Hou et al.

(10) Patent No.: US 11,051,414 B2
(45) Date of Patent: Jun. 29, 2021

(54) DEVICE FOR AUTOMATICALLY FOLDING FLEXIBLE DISPLAY SCREEN

(71) Applicant: Yungu (Gu'an) Technology Co., Ltd., Langfang (CN)

(72) Inventors: Hongqi Hou, Langfang (CN); Fu Liao, Langfang (CN); Liwei Ding, Langfang (CN); Yuhua Wu, Langfang (CN); Zhaoji Zhu, Langfang (CN); Kanglong Sun, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/847,724

(22) Filed: Apr. 14, 2020

(65) Prior Publication Data
US 2020/0245478 A1    Jul. 30, 2020

Related U.S. Application Data

(63) Continuation of application No. PCT/CN2019/078132, filed on Mar. 14, 2019.

(30) Foreign Application Priority Data
Sep. 19, 2018   (CN) .......................... 201821534740.3

(51) Int. Cl.
*H05K 5/00*    (2006.01)
*H05K 5/02*    (2006.01)
*H05K 5/03*    (2006.01)

(52) U.S. Cl.
CPC ......... *H05K 5/0017* (2013.01); *H05K 5/0247* (2013.01); *H05K 5/03* (2013.01)

(58) Field of Classification Search
None
See application file for complete search history.

(56) References Cited

U.S. PATENT DOCUMENTS

| | | | |
|---|---|---|---|
| 9,081,540 B1 * | 7/2015 | Cho | ...................... G06F 1/1601 |
| 9,123,290 B1 * | 9/2015 | Cho | ....................... G09F 9/301 |
| 9,535,452 B2 | 1/2017 | Ahn | |
| 9,557,771 B2 * | 1/2017 | Park | ...................... G06F 1/1681 |

(Continued)

FOREIGN PATENT DOCUMENTS

| CN | 105788452 A | 7/2016 |
|---|---|---|
| CN | 106157819 A | 11/2016 |

(Continued)

OTHER PUBLICATIONS

PCT International Search Report of PCT/CN2019/078132 dated Jun. 11, 2019.

(Continued)

*Primary Examiner* — Xanthia C Cunningham
(74) *Attorney, Agent, or Firm* — Ladas & Parry LLP

(57) ABSTRACT

The present application provides a device for automatically folding a flexible display screen, including: a screen movable supporting component, configured to support a portion of the flexible display screen; a bending driving device, configured to drive the screen movable supporting component to perform a variable radius rotation to perform a bending action of the flexible display screen. The larger a bending angle of the flexible display screen is, the smaller a rotation radius of the screen movable supporting component is.

20 Claims, 4 Drawing Sheets

(56) References Cited

U.S. PATENT DOCUMENTS

| | | | | |
|---|---|---|---|---|
| 9,600,035 | B2* | 3/2017 | Park | G06F 1/1652 |
| 9,697,941 | B2 | 7/2017 | Lee | |
| 9,978,293 | B2* | 5/2018 | Cho | H05K 5/03 |
| 9,980,399 | B2* | 5/2018 | Cho | G09F 9/301 |
| 9,983,428 | B2* | 5/2018 | Im | G09F 13/0413 |
| 10,054,990 | B1* | 8/2018 | Harmon | G06F 1/1679 |
| 10,824,189 | B2* | 11/2020 | Lin | H04M 1/0268 |
| 2012/0002360 | A1* | 1/2012 | Seo | G06F 1/1652 |
| | | | | 361/679.01 |
| 2012/0154999 | A1* | 6/2012 | Park | H04M 1/0237 |
| | | | | 361/679.01 |
| 2013/0010405 | A1* | 1/2013 | Rothkopf | H05K 5/0226 |
| | | | | 361/679.01 |
| 2014/0198465 | A1* | 7/2014 | Park | G09F 9/301 |
| | | | | 361/749 |
| 2015/0233162 | A1* | 8/2015 | Lee | G06F 1/1626 |
| | | | | 16/223 |
| 2016/0302314 | A1* | 10/2016 | Bae | G06F 1/16 |
| 2016/0353593 | A1* | 12/2016 | Park | F16M 11/16 |
| 2016/0374228 | A1* | 12/2016 | Park | H05K 7/16 |
| 2017/0193863 | A1 | 7/2017 | Cho et al. | |
| 2017/0315401 | A1* | 11/2017 | Im | G02F 1/133308 |
| 2018/0160554 | A1* | 6/2018 | Kang | B21B 39/008 |
| 2018/0210511 | A1* | 7/2018 | Lin | E05D 11/0054 |
| 2018/0220537 | A1* | 8/2018 | Heo | G09F 9/3026 |
| 2018/0226001 | A1* | 8/2018 | Chen | G09F 15/0031 |

FOREIGN PATENT DOCUMENTS

| | | |
|---|---|---|
| CN | 107631861 A | 1/2018 |
| WO | 2018/129783 A1 | 7/2018 |

OTHER PUBLICATIONS

PCT Written Opinion of PCT/CN2019/078132 dated Jun. 11, 2019.
European Search Result in Application No. 19861816.7 dated Apr. 12, 2021.

* cited by examiner

DEVICE FOR AUTOMATICALLY FOLDING FLEXIBLE DISPLAY SCREEN

CROSS-REFERENCE TO RELATED APPLICATIONS

The present application is a continuation of International Application No. PCT/CN2019/078132 filed on Mar. 14, 2019, which claims priority to Chinese patent application No. 201821534740.3 filed on Sep. 19, 2018. Both applications are incorporated herein by reference in their entireties.

TECHNICAL FIELD

The present application relates to the field of automation device technologies, more particularly to a device for automatically folding a flexible display screen.

BACKGROUND

Because an Organic Light-Emitting Diode (OLED) emits light by itself, its volume is thin, its energy consumption is small, and it is flexible, such a display technology may be used in military, medical, exhibition and other occasions. Current display industries is making terminal products such as mobile phones develop in terms of flexibility based on its flexible and foldable advantages, and current display leading enterprises are gradually beginning to lay out folding displays. But due to a limitation of folding structures, a flexible folding screen as an emerging display product still exists a phenomenon of "dead folding" or stretching easily formed in a folding region, thereby causing the display screen to fail to display normally.

SUMMARY

In view of this, the present application provides a device for automatically folding a flexible display screen, which solves a problem that a phenomenon of "dead folding" or stretching is easily formed in a folding region of the flexible display screen and causes the display screen to fail to display normally.

According to an aspect of the present application, a device for automatically folding a flexible display screen is provided, including: a screen movable supporting component, configured to support a portion of the flexible display screen; and a bending driving device, configured to drive the screen movable supporting component to perform a variable radius rotation around a fixed rotating shaft to perform a bending action of the flexible display screen. The larger a bending angle of the flexible display screen is, the smaller a rotation radius of the screen movable supporting component is.

In an embodiment, the bending driving device includes: a cam having an arcuate surface with a variable radius of curvature; and a driving mechanism, configured to drive the screen movable supporting component to rotate along the arcuate surface of the cam.

In an embodiment, the driving mechanism includes: a motor; and a driving component disposed between the motor and the cam. The motor rotates to drive the driving component to drive the screen movable supporting component to rotate along the arcuate surface.

In an embodiment, the driving component includes: a fixing seat, disposed on a motor head of the motor, an end of the fixing seat being connected to the cam; a rotating linkage, disposed on the fixing seat; a slider, connected to an end of the rotating linkage away from the fixing seat; a spring, disposed between the cam and the slider; a slider platen, disposed on an end of the spring away from the slider, the slider platen and the rotating linkage being locked by a screw; and a bearing, disposed on the rotating linkage, and locked with the rotating linkage by a screw.

In an embodiment, the device for automatically folding a flexible display screen further includes a base. The base includes a through hole, and the driving mechanism is disposed in the through hole.

In an embodiment, a shape of the base is one or more of the following shapes: rectangle and circle.

In an embodiment, a shape of the through hole is one or more of the following shapes: circle and square.

In an embodiment, a material of the base is one or more of the following materials: metal and plastic.

In an embodiment, the device for automatically folding a flexible display screen further includes a driving circuit board, disposed on the base, and configured to drive the motor to rotate; and a cable, disposed on the base. One end of the cable is electrically connected to the driving circuit board, and the other end of the cable is electrically connected to the motor.

In an embodiment, the driving circuit board is disposed inside the through hole, or the driving circuit board is disposed at a side of the base adjacent to the motor, or the driving circuit board is disposed at a side of the base adjacent to the screen movable supporting component.

In an embodiment, the device for automatically folding a flexible display screen further includes an upper cover, covering a surface of an end of the through hole adjacent to the screen movable supporting component. The cam is disposed inside the upper cover.

In an embodiment, a shape of the upper cover is one or more of the following shapes: circle and rectangle.

In an embodiment, a material of the upper cover is one or more of the following materials: metal and plastic.

In an embodiment, the device for automatically folding a flexible display screen further includes a bottom cover, covering a surface of an end of the through hole away from the upper cover.

In an embodiment, a shape of the bottom cover is one or more of the following shapes: rectangle and circle.

In an embodiment, a material of the bottom cover is one or more of the following materials: metal and plastic.

In an embodiment, the device for automatically folding a flexible display screen further includes a screen fixed supporting component, fixed on an end of the upper cover away from the base, and arranged side by side with the screen movable supporting component on both sides of a folding region of the flexible display screen.

In an embodiment, the device for automatically folding a flexible display screen further includes a soft rubber rotating shaft, disposed between the screen movable supporting component and the screen fixed supporting component, configured to connect the screen movable supporting component with the screen fixed supporting component.

In an embodiment, the device for automatically folding a flexible display screen further includes a screen fixing plate, disposed on the screen fixed supporting component, and configured to fix the flexible display screen.

In an embodiment, a material of the screen fixing plate is one or more of the following materials: metal and wood.

In an embodiment, the device for automatically folding a flexible display screen further includes at least one screen batten, fixed on the screen movable supporting component and the screen fixing plate, and configured to fix the flexible display screen.

In an embodiment, the motor is a servo motor.

The embodiments of the present application provide a device for automatically folding a flexible display screen. The device for automatically folding a flexible display screen includes a screen movable supporting component and a bending driving device. The screen movable supporting component is configured to support a portion of the flexible display screen, and the bending driving device is configured to drive the screen movable supporting component to perform a variable radius rotation around a fixed rotating shaft to perform a bending action of the flexible display screen. The larger a bending angle of the flexible display screen is, the smaller a rotation radius of the screen movable supporting component is. For example, when the flexible display screen is changed from a flattened state to a folded state, the rotation radius is decreased, and when the flexible display screen is changed from the folded state to the flattened state, the rotation radius is increased, which changes the stress on the flexible display screen during a stretching process, and avoids a problem that the flexible display screen may not be displayed normally due to screen failure caused by stretching during a bending process.

DETAILED DESCRIPTION

A clear and complete description of technical solutions in the embodiments of the present application will be given below, in combination with the accompanying drawings in the embodiments of the present application. Apparently, the embodiments described below are a part, but not all, of the embodiments of the present application. All other embodiments, obtained by those skilled in the art based on the embodiments of the present application without any creative efforts, shall fall within the protection scope of the present application.

Figure 1:
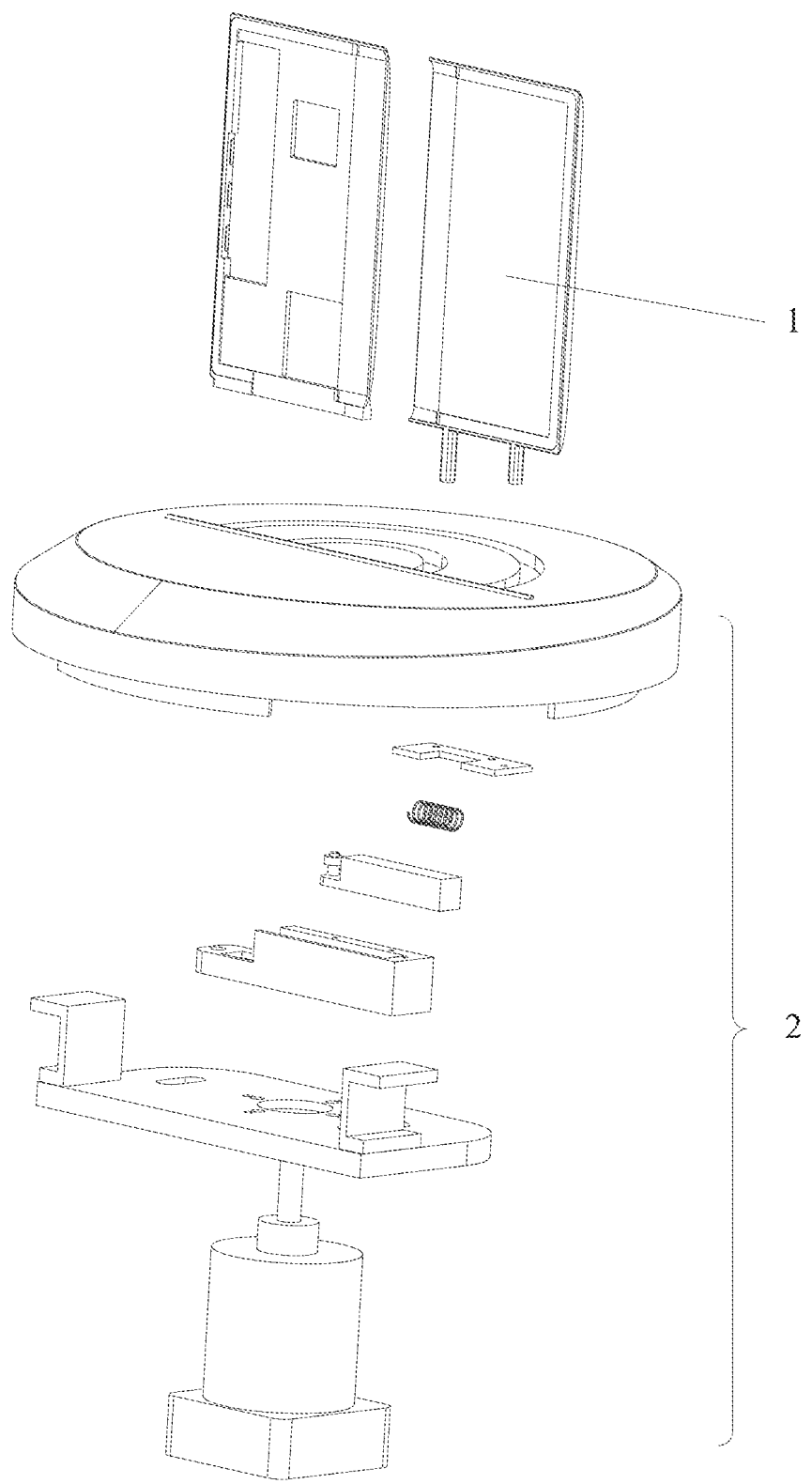
FIG. 1 is a schematic structural diagram illustrating a device for automatically folding a flexible display screen according to an embodiment of the present application.
Figure 2:
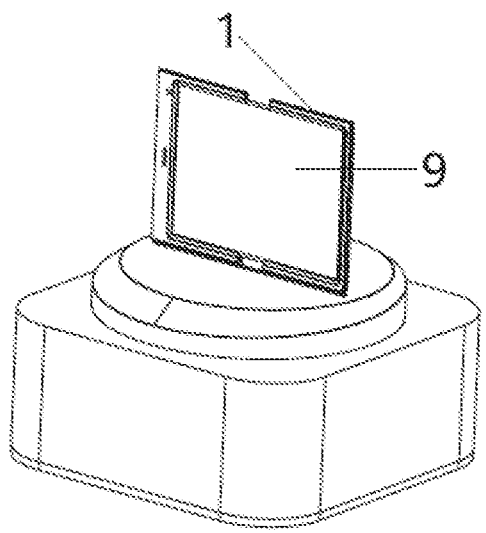
FIG. 2 is a schematic structural diagram illustrating a device for automatically folding a flexible display screen according to an embodiment of the present application.

FIG. 1 is a schematic structural diagram illustrating a device for automatically folding a flexible display screen according to an embodiment of the present application. FIG. 2 is a schematic structural diagram illustrating a device for automatically folding a flexible display screen according to an embodiment of the present application.

As shown in FIG. 1 and FIG. 2, the device for automatically folding a flexible display screen includes a screen movable supporting component 1 and a bending driving device 2. The screen movable supporting component 1 is configured to support a portion of the flexible display screen 9, and the bending driving device 2 is configured to drive the screen movable supporting component 1 to perform a variable radius rotation around a fixed rotating shaft, thereby performing a bending action of the flexible display device. The fixed rotating shaft is disposed in a direction of a bending central axis of a bending region of the flexible display screen 9. The fixed rotating shaft may be a solid rotating shaft, the solid rotating shaft is disposed in the direction of the bending central axis of the bending region of the flexible display screen 9, and the bending driving device 2 drives the screen movable supporting component 1 to perform a variable radius motion around the solid rotating shaft. Alternatively, the fixed rotating shaft may also be a virtual rotating shaft, that is, there is no solid rotating shaft. For example, the bending driving device 2 drives the screen movable supporting component 1 to perform the variable radius motion only around the direction of the bending central axis of the bending region of the flexible display screen 9. The fixed rotating shaft may be a virtual rotating shaft or a solid rotating shaft, which is not limited in the present application. The larger a bending angle of the flexible display screen 9 is, the smaller a rotation radius of the screen movable supporting component 1 is. For example, when the flexible display screen 9 is changed from a flattened state to a folded state, the rotation radius is decreased; and when the flexible display screen 9 is changed from the folded state to the flattened state, the rotation radius is increased. Thus the stress on the flexible display screen 9 during a stretching process is changed, and a problem that the flexible display screen 9 may not be displayed normally due to screen failure caused by stretching during a bending process is avoided.

It can be understood that the bending of the flexible display screen 9 may be a bending toward a side facing the display screen, or may be a bending toward a side away from the display screen, and the bending direction of the flexible display screen 9 is not limited by the present application.

Figure 3:
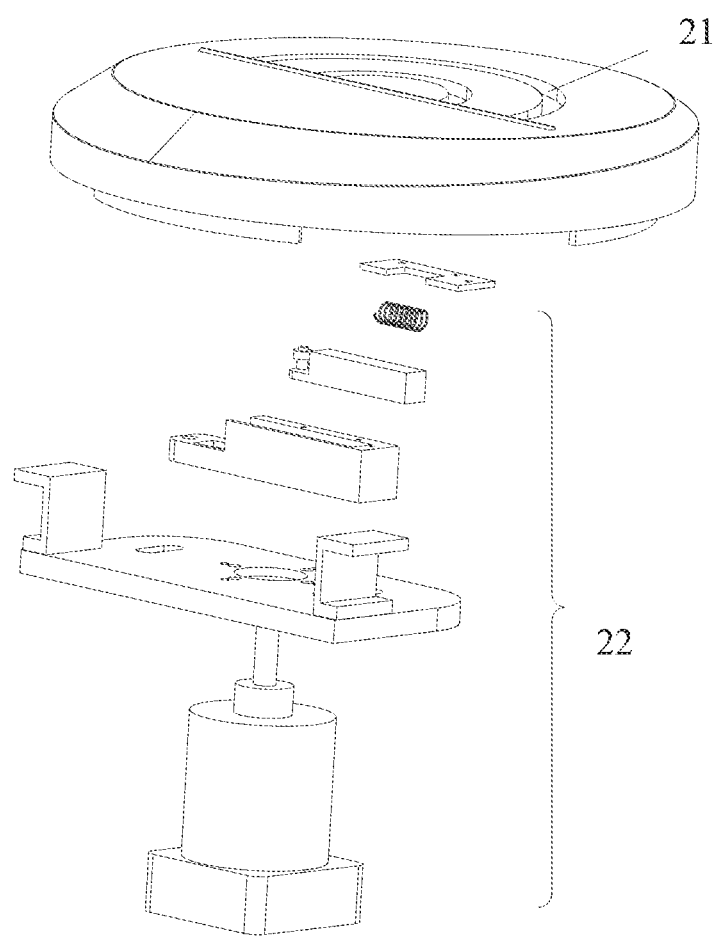
FIG. 3 is a schematic structural diagram illustrating a bending driving device according to an embodiment of the present application.

FIG. 3 is a schematic structural diagram illustrating a bending driving device 2 according to an embodiment of the present application.

As shown in FIG. 3, the bending driving device 2 includes a cam 21 having an arcuate surface with a variable radius of curvature and a driving mechanism 22. The cam 21 is used to change a moving radius of the screen movable supporting component 1 so that the screen movable supporting component 1 rotates along the arcuate surface of the cam 21. The driving mechanism 22 is configured to drive the screen movable supporting component 1 to rotate along the arcuate surface of the cam 21. The driving mechanism 22 drives the screen movable supporting component 1 to perform a variable curvature radius rotation along the arcuate surface of the cam 21. When the flexible display screen 9 is changed from a flattened state to a folded state, the rotation radius is decreased, and when the flexible display screen 9 is changed from the folded state to the flattened state, the rotation radius is increased. Thus the stress on the flexible display screen 9 during a stretching process is changed, and a problem that the flexible display screen 9 may not be displayed normally due to screen failure caused by stretching during a bending process is avoided.

It can be understood that a curvature of the arcuate surface of the cam 21 with the variable curvature radius may be designed according to a specific folding manner of the flexible display screen 9, and the present application is not limited to a specific curvature of the variable curvature radius of the cam 21.

Figure 4:
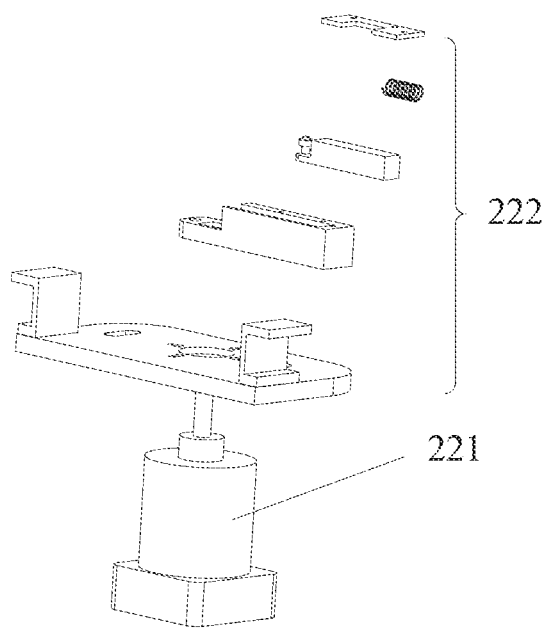
FIG. 4 is a schematic structural diagram illustrating a driving mechanism according to an embodiment of the present application.

FIG. 4 is a schematic structural diagram illustrating a driving mechanism 22 according to an embodiment of the present application.

As shown in FIG. 4, the driving mechanism 22 includes a motor 221 and a driving component 222. The driving component 222 is disposed between the motor 221 and the cam 21, and the motor 221 rotates to drive the driving component 222 to move. The driving component 222 drives the screen movable supporting component 1 to rotate along the arcuate surface of the cam 21 during moving, thereby realizing a change of the moving radius of the screen movable supporting component 1, thus the stress on the flexible display screen 9 during a folding process is reduced, and a problem that the flexible display screen 9 may not be displayed normally due to screen failure caused by stretching during a bending process is avoided.

It can be understood that the motor 221 may be a servo motor, a stepping motor, a common motor, or the like. The present application is not limited to a specific type of the motor 221 under the premise that the motor 221 may drive the screen movable supporting component to perform a variable radius rotation along the shape of the cam 21.

Figure 5:
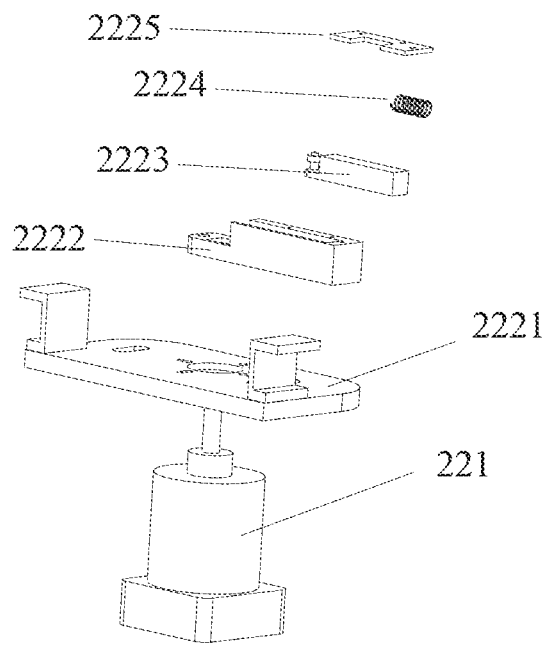
FIG. 5 is a schematic structural diagram illustrating a driving component according to an embodiment of the present application.

FIG. 5 is a schematic structural diagram illustrating a driving component according to an embodiment of the present application.

As shown in FIG. 5, in an embodiment of the present application, the driving component 222 includes a fixing seat 2221, a rotating linkage 2222, a slider platen 2225, a slider 2223, a spring 2224, and a bearing. The fixing seat 2221 is connected to a head of the motor 221; the rotating linkage 2222 is disposed on an end of the fixing seat 2221 away from the motor 221; the slider 2223 is connected to an end of the rotating linkage 2222 away from the fixing seat 2221; the spring 2224 is disposed between the slider 2223 and the cam 21; and the slider platen and the rotating linkage 2222 are locked by a screw, the bearing is mounted on the rotating linkage 2222, and the bearing and the rotating linkage 2222 may be locked by a screw. By fixing the screen movable supporting component 1 to the slider 2223 and assembling the slider 2223 on the rotating linkage 2222, when the motor 221 drives the rotating linkage 2222, the slider 2223 drives the screen movable supporting component 1 to perform a variable radius rotation along the shape of the cam 21 under the elastic force of the spring 2224, so that phenomena such as folding fatigue and folding failure caused by stretching may be avoided when the screen is bent.

It can be understood that a screw fixing manner mentioned in this embodiment may also be a rivet fixing manner, and the present application is not limit to a specific fixing workpiece.

Figure 6:
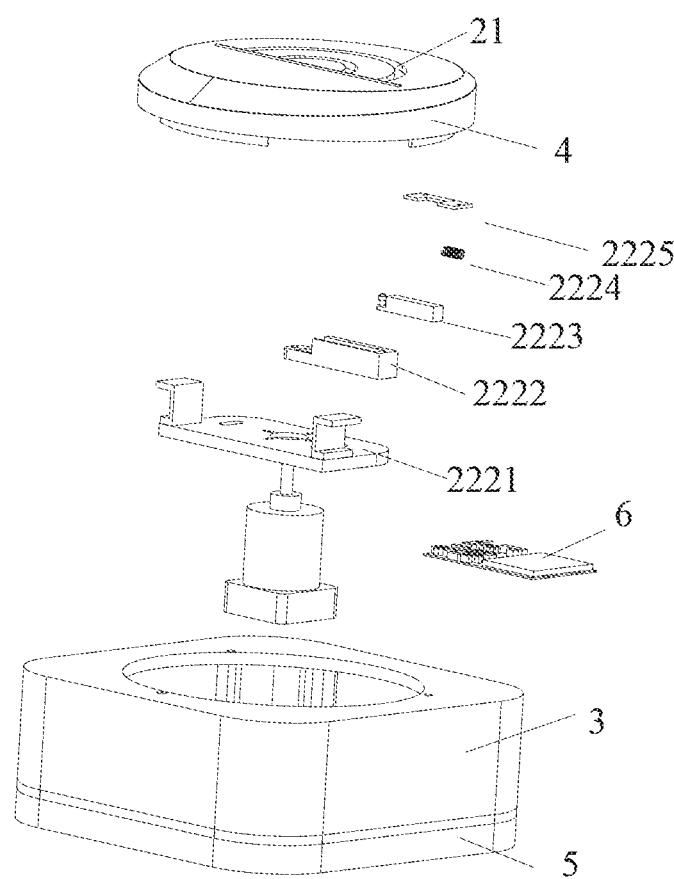
FIG. 6 is a schematic structural diagram illustrating an upper cover, a base, and a bottom cover according to an embodiment of the present application.

FIG. 6 is a schematic structural diagram illustrating an upper cover 4, a base 3, and a bottom cover 5 according to an embodiment of the present application.

As shown in FIG. 6, the device for automatically folding a flexible display screen further includes a base 3, and the base 3 includes a through hole. A driving mechanism 22 is disposed in the through hole, and the base 3 may surround a supporting component supporting the motor 221 and the motor 221, thereby protecting and beautifying the supporting component and the motor 221.

It can be understood that the through hole of the base 3 may be a circular through hole, a square through hole, an irregularly shaped through hole, or the like. In a case of easy implementation, convenient operation and installation, the present application is not limited to the specific shape of the through hole of the base 3.

It can also be understood that the shape of the base 3 may be an orthogon, a rectangle, a circle, an orthogon with four rounded corners, a rectangle with four rounded corners, or the like, and the present application is not limited to an outer shape of the base 3.

It can also be understood that a material of the base 3 may be metal, plastic, or the like, and the present application is not limited to the specific material of the base 3.

In an embodiment of the present application, the device for automatically folding a flexible display screen includes a driving circuit board 6 and a cable. The driving circuit board 6 is disposed on the base 3 and fixed to the base 3 by a screw. The cable is disposed on the base 3 and electrically connected to the driving circuit board 6. One end of the cable is electrically connected to the driving circuit board 6, and the other end is electrically connected to the motor 221. The driving circuit board 6 and the cable are configured to drive and control the rotation of the motor 221, and the rotation of the motor 221 drives the rotation of the screen movable supporting component, thereby realizing that the flexible display screen 9 gets rid of manual work and realizes the function of automatic bending.

It can be understood that the driving circuit board 6 may be disposed inside the through hole of the base 3, and may also be disposed on a side of the base 3 adjacent to a fixing component of the motor 221, or may also be disposed on a side of the base 3 adjacent to the screen movable supporting component. The present application is not limited to the specific position where the driving circuit board 6 is located in the motor 221.

In an embodiment of the present application, the device for automatically folding the flexible display screen further includes an upper cover 4 covering the base 3, and is disposed on an end of the base 3 adjacent to the screen movable supporting component. The cam 21 is disposed inside the upper cover 4. The upper cover 4 may protect the supporting component of the motor 221 and the motor 221, and beautify the device for automatically folding the flexible display screen.

It can be understood that the shape of the upper cover 4 may be an orthogon, a rectangle, a circle, or the like, and the present application is not limited to the outer shape of the upper cover 4.

It can also be understood that the material of the upper cover 4 may be metal, plastic or the like, and the present application is not limited to the specific material of the upper cover 4.

In an embodiment of the present application, the device for automatically folding the flexible display screen further includes a bottom cover 5 covering the base 3, and is disposed under a bottom of the base 3 away from the upper cover 4. The bottom cover 5 may play a role in protecting and supporting the motor 221, and may prevent components such as the motor 221 from falling out due to the weak connection, which affects the exhibition effect.

It can be understood that the shape of the bottom cover 5 may be an orthogon, a rectangle, a circle, or the like, and the present application is not limited to the outer shape of the bottom cover 5.

It can also be understood that the material of the bottom cover 5 may be metal, plastic, or the like, and the present application is not limited to the specific material of the bottom cover 5.

Figure 7:
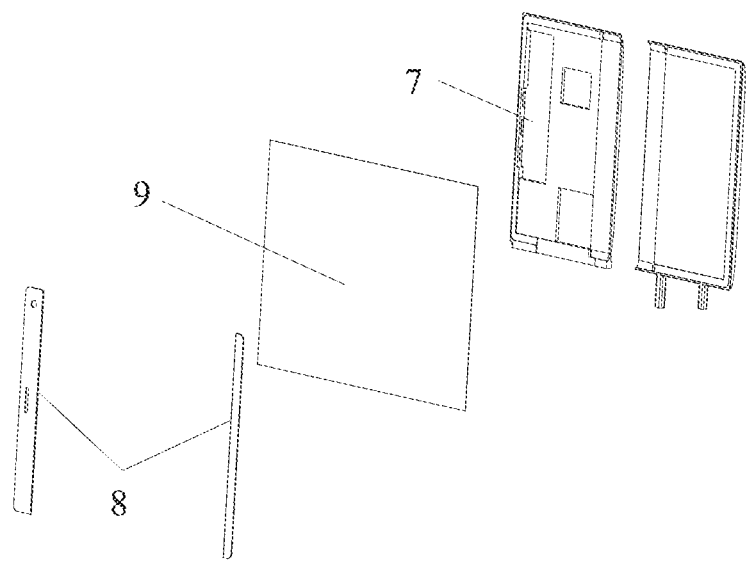
FIG. 7 is a schematic structural diagram illustrating a screen fixed supporting component according to an embodiment of the present application.

FIG. 7 is a schematic structural diagram illustrating a screen fixed supporting component according to an embodiment of the present application.

As shown in FIG. 7, a screen supporting component includes a screen movable supporting component 1 and a screen fixed supporting component 7. The screen movable supporting component 1 and the screen fixed supporting component 7 are arranged side by side on both sides of a folding region of the flexible display screen 9. The screen movable supporting component 1 is configured to support one side of the folding region of the flexible display screen 9, and the screen fixed supporting component 7 is configured to support the other side of the folding region of the flexible display screen 9. A side of the screen movable supporting component 1 adjacent to the cam 21 is connected to the cam 21. When the motor 221 rotates, the motor 221 drives the screen movable supporting component 1 to perform a variable radius motion along the outer shape of the cam 21, and the screen fixed supporting component 7 is fixed, thereby realizing that when the motor 221 rotates, a portion of the flexible display screen 9 fixed on the screen fixed supporting component 7 is fixed, and a portion of the flexible display screen 9 fixed on the screen movable supporting component 1 is driven by the motor 221 to perform a variable radius motion along the cam 21, realizing a function of automatically folding and unfolding of the flexible display screen 9, and saving labor cost. The automatic folding device may be configured for exhibitions, improving the exhibition efficiency and effect.

In an embodiment of the present application, the screen supporting component further includes a soft rubber rotating shaft, and the soft rubber rotating shaft is disposed between the screen movable supporting component 1 and the screen fixed supporting component 7 for connecting the screen movable supporting component 1 and the screen fixed supporting component 7. The screen movable supporting component 1 drives the soft rubber rotating shaft to rotate together when rotating, so that the screen movable supporting component 1 drives a portion of the flexible display screen 9 to rotate, and the screen fixed supporting component 7 fixes the rest of the flexible display screen 9 so as not to rotate. The material of the soft rubber rotating shaft may be soft rubber. The soft rubber has elasticity, and does not scratch or squeeze the flexible display screen 9 during a rotation process, which protects the flexible display screen 9.

In an embodiment of the present application, the device for automatically folding the flexible display screen includes a screen fixing plate. The screen fixing plate is disposed on a screen fixed supporting component for fixing the flexible display screen 9, which may prevent a fixed portion of the flexible display screen 9 from moving during a folding process and affecting a rotating effect.

It can be understood that the screen fixing plate may be made of metal, wood or other materials capable of satisfying a fixing effect, and the present application is not limited to the specific material of the screen fixing plate.

In an embodiment of the present application, the device for automatically folding the flexible display screen includes a plurality of screen battens 8. A portion of the flexible display screen 9 is fixed on the screen fixed supporting component 7, and the rest of the flexible display screen 9 is fixed on the screen movable supporting component 1. The screen battens 8 are pressed on a surface of the flexible display screen 9, and the screen batten 8 and the screen supporting component are fixed by a screw, so that the flexible display screen 9 is fixed on the device for automatically folding flexible display screen, and the position of the flexible display screen 9 is prevented from shifting during an automatic bending process, thereby improving the bending effect.

It can be understood that the number of the screen battens 8 may be at least two. When the screen battens 8 include two screen battens, the screen battens 8 may be frame-shaped structures, and disposed on opposite ends of a bending line of the flexible display screen 9 respectively. After placing the rectangular frame on a surface of the flexible display screen 9, one screen batten 8 is connected to the screen fixed supporting component 7, and the other screen batten 8 is connected to the screen movable supporting component 1. When the screen battens 8 include a plurality of screen battens 8, the plurality of screen battens 8 are distributed on both sides of a bending region of the flexible display screen 9 respectively. At this time, the screen batten 8 may be formed into a strip, and the plurality of screen battens 8 are connected and fixed to the screen fixed supporting component 7 and the screen movable supporting component 1 respectively. In the case of ensuring that the flexible display screen 9 may be firmly fixed on the screen supporting component, and position shifts are not easy to occur during rotating, the present application is not limited to the number and shape of the screen battens 8.

The above are only the preferred embodiments of the present application and are not intended to limit the present application. Any modifications, equivalent substitutions and the like made within the spirit and principle of the present application should be included within the protection scope of the present application.

What is claimed is:

1. A device for automatically folding a flexible display screen, comprising:
    a screen movable supporting component supporting the flexible display screen; and
    a bending driving device driving the screen movable supporting component to perform a variable radius rotation around a fixed rotating shaft to perform a bending action of the flexible display screen,
    wherein the larger a bending angle of the flexible display screen is, the smaller a rotation radius of the screen movable supporting component is.

2. The device according to claim 1, wherein when the flexible display screen is changed from a flattened state to a folded state, the rotation radius of the screen movable supporting component is decreased, and when the flexible display screen is changed from the folded state to the flattened state, the rotation radius of the screen movable supporting component is increased.

3. The device according to claim 1, wherein the bending driving device comprises:
    a cam having an arcuate surface with a variable radius of curvature; and
    a driving mechanism, configured to drive the screen movable supporting component to rotate along the arcuate surface of the cam.

4. The device according to claim 3, wherein the driving mechanism comprises:
    a motor; and
    a driving component disposed between the motor and the cam, wherein the motor rotates to drive the driving component to drive the screen movable supporting component to rotate along the arcuate surface.

5. The device according to claim 4, wherein the driving component comprises:
    a fixing seat, disposed on a motor head of the motor, an end of the fixing seat being connected to the cam;

a rotating linkage, disposed on an end of the fixing seat away from the motor;

a slider, connected to an end of the rotating linkage away from the fixing seat;

a spring, disposed between the cam and the slider;

a slider platen, disposed on an end of the spring away from the slider, the slider platen and the rotating linkage being locked by a screw; and a bearing, disposed on the rotating linkage, and locked with the rotating linkage by a screw.

6. The device according to claim 3, further comprising a base, wherein the base comprises a through hole, and the driving mechanism is disposed in the through hole.

7. The device according to claim 6, wherein a shape of the base is following shapes: rectangle or circle;

a material of the base is one or more of the following materials: metal and plastic.

8. The device according to claim 6, further comprising:

a driving circuit board, fixed on the base and driving the motor to rotate; and a cable, disposed on the base, wherein one end of the cable is electrically connected to the driving circuit board, and the other end of the cable is electrically connected to the motor.

9. The device according to claim 8, wherein the driving circuit board is disposed inside the through hole, or the driving circuit board is disposed at a side of the base adjacent to the motor, or the driving circuit board is disposed at a side of the base adjacent to the screen movable supporting component.

10. The device according to claim 6, further comprising an upper cover, covering a surface of an end of the through hole adjacent to the screen movable supporting component, wherein the cam is disposed inside the upper cover.

11. The device according to claim 10, wherein a shape of the upper cover is one or more of the following shapes: rectangle and circle;

a material of the upper cover is one or more of the following materials: metal and plastic.

12. The device according to claim 10, further comprising a bottom cover, covering a surface of an end of the through hole away from the upper cover.

13. The device according to claim 12, wherein a shape of the bottom cover is one or more of the following shapes: rectangle and circle;

a material of the bottom cover is one or more of the following materials: metal and plastic.

14. The device according to claim 10, further comprising a screen fixed supporting component, fixed on an end of the upper cover away from the base, and arranged side by side with the screen movable supporting component on both sides of a folding region of the flexible display screen.

15. The device according to claim 14, further comprising a soft rubber rotating shaft, disposed between the screen movable supporting component and the screen fixed supporting component, configured to connect the screen movable supporting component with the screen fixed supporting component.

16. The device according to claim 14, further comprising a screen fixing plate, disposed on the screen fixed supporting component to fix the flexible display screen.

17. The device according to claim 16, further comprising at least one screen batten fixed on the screen movable supporting component and the screen fixing plate to fix the flexible display screen.

18. The device according to claim 17, wherein the at least one screen batten includes two screen battens, the screen battens are frame-shaped structures, disposed on opposite ends of a bending line of the flexible display screen respectively, one screen batten is connected to the screen fixed supporting component, and the other screen batten is connected to the screen movable supporting component.

19. The device according to claim 17, wherein the at least one screen batten includes a plurality of screen battens, distributed on two sides of a bending region of the flexible display screen respectively, the screen batten is formed into a strip, and the plurality of screen battens are connected and fixed to the screen fixed supporting component and the screen movable supporting component respectively.

20. The device according to claim 4, wherein the motor is a servo motor.

* * * * *